United States Patent
Naumann et al.

(10) Patent No.: US 11,127,683 B2
(45) Date of Patent: Sep. 21, 2021

(54) SEMICONDUCTOR STRUCTURE WITH SUBSTANTIALLY STRAIGHT CONTACT PROFILE

(71) Applicant: GLOBALFOUNDRIES U.S. INC., Santa Clara, CA (US)

(72) Inventors: Ronald Naumann, Dresden (DE); Matthias Zinke, Dresden (DE); Robert Seidel, Dresden (DE); Tobias Barchewitz, Radebeul (DE)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/374,969

(22) Filed: Apr. 4, 2019

(65) Prior Publication Data

US 2019/0229063 A1 Jul. 25, 2019

Related U.S. Application Data

(62) Division of application No. 15/817,801, filed on Nov. 20, 2017, now abandoned.

(51) Int. Cl.
*H01L 23/532* (2006.01)
*H01L 23/528* (2006.01)
(Continued)

(52) U.S. Cl.
CPC .. *H01L 23/53295* (2013.01); *H01L 21/76802* (2013.01); *H01L 21/76879* (2013.01);
(Continued)

(58) Field of Classification Search
CPC ............. H01L 23/53295; H01L 23/528; H01L 21/76816; H01L 21/76879
See application file for complete search history.

(56) References Cited

U.S. PATENT DOCUMENTS 6,251,770 B1 * 6/2001 Uglow .............. H01L 21/02304
438/624
6,593,247 B1 7/2003 Huang et al.
(Continued)

FOREIGN PATENT DOCUMENTS

DE 10240176 4/2004
TW 200416881 9/2004
(Continued)

OTHER PUBLICATIONS

Williams, Kirt, "Etch Rates for Micromachining Processing", Journal of microelectromechanical systems, vol. 5. No. 4, Dec. 1996 (Year: 1996).*
(Continued)

*Primary Examiner* — Vincent Wall
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to a semiconductor structure with a substantially straight contact profile and methods of manufacture. The structure includes a block material comprising an upper oxidized layer at an interface with an insulating material; and an interconnect contact structure with a substantially straight profile through the oxidized layer of the block material.

19 Claims, 2 Drawing Sheets

(51) Int. Cl.
  *H01L 21/768* (2006.01)
  *H01L 21/288* (2006.01)
  *H01L 21/311* (2006.01)
  *H01L 21/285* (2006.01)

(52) U.S. Cl.
  CPC ........ *H01L 23/528* (2013.01); *H01L 21/2885* (2013.01); *H01L 21/28556* (2013.01); *H01L 21/31116* (2013.01)

(56) References Cited

U.S. PATENT DOCUMENTS

| | | | |
|---|---|---|---|
| 6,927,161 | B2 | 8/2005 | Ruelke et al. |
| 7,402,532 | B2 | 7/2008 | Clevenger et al. |
| 7,615,482 | B2 | 11/2009 | Edelstein et al. |
| 7,807,567 | B2 | 10/2010 | Kawano et al. |
| 8,017,522 | B2 * | 9/2011 | Lin ............... H01L 21/3105 257/753 |
| 8,685,867 | B1 * | 4/2014 | Danek ............ H01L 21/3105 438/787 |
| 2001/0000115 | A1 * | 4/2001 | Greco ............ H01L 21/31116 257/773 |
| 2004/0121621 | A1 | 6/2004 | Ruelke et al. |
| 2004/0224497 | A1 | 11/2004 | Barth |
| 2004/0266201 | A1 | 12/2004 | Wille et al. |
| 2005/0233591 | A1 | 10/2005 | Schmitt et al. |
| 2007/0117313 | A1 * | 5/2007 | Yang ............... H01L 23/5223 438/253 |
| 2008/0173984 | A1 | 7/2008 | Lin et al. |
| 2011/0237085 | A1 | 9/2011 | Schmitt et al. |
| 2011/0318942 | A1 | 12/2011 | Lin et al. |
| 2013/0087923 | A1 | 4/2013 | Gates et al. |
| 2015/0376211 | A1 * | 12/2015 | Girard ............ C07F 7/025 428/447 |
| 2016/0343822 | A1 | 11/2016 | Hsiao et al. |

FOREIGN PATENT DOCUMENTS

| | | |
|---|---|---|
| TW | 200425341 | 11/2004 |
| TW | 200511432 | 3/2005 |
| TW | 201709506 | 3/2017 |

OTHER PUBLICATIONS

Carrillo-Lopez et al., "Characterization of the oxidation rate of densified SiN thin films by Auger and infrared absorption spectroscopies", Thin Solid Films 311 (1997) 38-43 (Year: 1997).*

Williams et al.,"Etch Rates for Micromachining Processing", Journal of Microelectromechanical Systems, vol. 5, No. 4, Dec. 1996, pp. 256-259 (Year: 1996).*

Meziani et al., "Compositional analysis of silicon oxide/silicon nitride thin films", Materials Science—Poland, 34(2), 2016, pp. 315-321 http://www.materialsscience.pwr.wroc.pl/ ,DOI: 10.1515/msp-2016-0057 (Year: 2016).*

Taiwanese Office Action dated Jun. 25, 2019 for TW Application No. 107102215, 13 pages.

Yuan et al., "Reducing Cu diffusion in SiCOH low-k films by O2 plasma treatment", Microelectronic Engineering, vol. 86, Issue 10, Oct. 2009, pp. 2119-2122.

German Office Action in the related DE Application No. 10 2018 202 132.5 dated Jul. 18, 2018, 94 pages.

Taiwanese Office Action in the related TW Application No. 107102215 dated Oct. 17, 2018, 10 pages.

Chen et al., "Effects of Oxygen Plasma Ashing on Barrier Dielectric SiCN Film", Electrochemical and Solid-State Letters, 8 (1) G11-G13 (2005).

King, Sean W., "Dielectric Barrier, Etch Stop, and Metal Capping Materials for State of the Art and beyond Metal Interconnects", ECS Journal of Solid State and Technology, 4 (1) N3029-N3047, 2005.

German Office Action dated Jun. 1, 2021 for TW Application No. 10 2018 202 132.5, 9 pages.

* cited by examiner

SEMICONDUCTOR STRUCTURE WITH SUBSTANTIALLY STRAIGHT CONTACT PROFILE

FIELD OF THE INVENTION

The present disclosure relates to semiconductor structures and, more particularly, to a semiconductor structure with a substantially straight contact profile and methods of manufacture.

BACKGROUND

Semiconductor devices include many different wiring layers. These wiring layers are formed in interlevel dielectric material and may include wiring structures, interconnect contacts, passive devices and active devices. The interconnect contacts are provided in different wiring layers of the die to connect to the different structures, e.g., different wiring structures, etc.

In manufacturing the semiconductor devices, an adhesion layer is typically formed at a bottom surface of the interlevel dielectric material, e.g., bulk SiCOH materials, above a wiring structure. The adhesion layer, though, has a different etch rate than the interlevel dielectric material, resulting in a tapered via profile. In other words, as the etch rate is different for the interlevel dielectric material and the adhesion layer, these materials will etch at a different rate resulting in a tapered profile within the adhesion layer. The tapered via profile, in turn, leads to interconnect contacts with tapered profiles. This tapered profile of the interconnect contacts leads to electrical performance issues including void formation in the metal material, e.g., copper, as well as and time-dependent gate oxide breakdown (TDDB).

The etching of these different materials is also known to be difficult to control as it is not possible to measure the thickness of the adhesion layer, in line. And, different thicknesses of the adhesion layer will generate different tapered via profiles.

SUMMARY

In an aspect of the disclosure, a structure comprises: a block material comprising an upper oxidized layer at an interface with an insulating material; and an interconnect contact structure with a substantially straight profile through the oxidized layer of the block material.

In an aspect of the disclosure, a structure comprises: a wiring layer formed in an insulator material; a block material comprising an upper surface composed of oxidized material; an interlevel dielectric material directly on the upper surface; and a contact extending to the wiring layer, through the block material, oxidized material and the interlevel dielectric material, the contact having a substantially straight profile within the oxidized material.

In an aspect of the disclosure, a method comprises: forming a blocking material over a wiring structure; oxidizing the blocking material to form an upper oxidized layer; forming an interlevel dielectric material over the oxidized layer; etching a via into the interlevel dielectric material, the oxidized layer and the blocking material to expose the wiring structure, the via having a substantially straight via profile through the oxidized layer; and forming a contact within the via, the contact having a substantially straight profile through the oxidized layer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a semiconductor structure with a substantially straight contact profile and methods of manufacture. More specifically, the present disclosure provides a substantially straight or vertical interconnect contact profile within an oxidized film in a blocking layer, below an interlevel dielectric material. Advantageously, by using the oxidized film, the present disclosure provides a more controllable via etching process, resulting in improved electrical parametric values of the interconnect contact, e.g., reduction in voids and time-dependent gate oxide breakdown (TDDB).

In embodiments, an oxygen treatment is provided to an upper surface of a BLoK (barrier low-k) layer, e.g., low-k dielectric insulator material. This oxygen treatment will improve taper control, e.g., etching, at the interface between an interlevel dielectric material and the BLoK layer. That is, by providing the oxygen treatment an oxidized layer of the BLoK layer will have a similar etch rate as the interlevel dielectric layer. The resulting via profile will, in turn, have a straight or substantially straight profile at the interface between the two materials, e.g., substantially 90 degrees as measured relative to the horizontal dielectric surface, as the oxidized layer and the interlevel dielectric layer will have a similar etch rate. In addition, by implementing the processes described herein, it is possible to eliminate the adhesion layer formed at the bottom of the interlevel dielectric layer that typically causes a tapered via profile during the etching process.

The structure of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structure can be built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
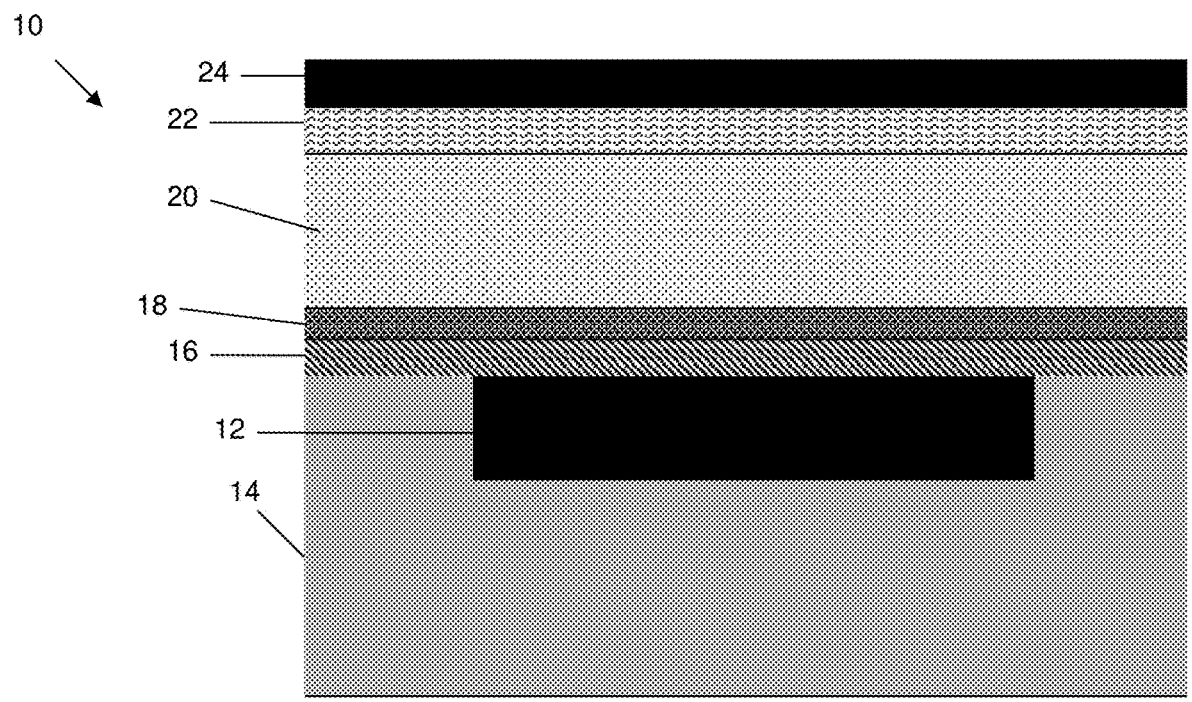
FIG. 1 shows a structure and respective fabrication processes in accordance with aspects of the present disclosure.

FIG. 1 shows a structure and respective fabrication processes in accordance with aspects of the present disclosure. Specifically, the structure 10 includes a wiring structure 12 formed in an insulator material 14. In embodiments, the insulator material 14 can be an oxide based material. The metal wiring structure 12 can be formed of a copper material, for example, using conventional lithography, etching and deposition processes.

For example, to form the wiring structure 12, a resist formed over the insulator material 14 is exposed to energy (light) to form a pattern (opening). An etching process with a selective chemistry, e.g., reactive ion etching (RIE), will be used to form one or more trenches in the insulator material 14 through the openings of the resist. The resist can then be removed by a conventional oxygen ashing process or other known stripants. Following the resist removal, the conductive material can be deposited by any conventional deposition processes, e.g., electroplating processes. Any residual material on the surface of the insulator material 14 can be removed by conventional chemical mechanical polishing (CMP) processes.

Still referring to FIG. 1, a block material 16 is formed over the insulator material 14 and the wiring structure 12. In embodiments, the block material 16 is a low-k dielectric layer e.g., nitride material. In more specific embodiments, the block material 16 can be an NBLoK (NBLoK is a trademark of Applied Materials, Inc.), which is a nitrogen-doped silicon carbide material. In embodiments, the block material 16 can be deposited by any conventional deposition process, e.g., chemical vapor deposition (CVD) processes, to a particular thickness depending on the technology node. By way non-limiting example, the thickness of the block layer and the thickness of the oxidized layer should be balanced such that the remaining block thickness is still sufficient to act as diffusion barrier.

In embodiments, the block material 16 undergoes an oxygen treatment to form an oxidized layer 18. In embodiments, the oxidized layer 18 can be at an upper surface of the block material and, more specifically, can extend about 5 nm to about 25 nm, depending on the technology node; although other thicknesses are also provided herein. In more specific examples, the oxidized layer 18 can be about 20% to about 30% of the thickness of the block material 16. In one specific embodiment, the oxidized layer 18 can be about 5 nm for a 35 nm thick block material 16.

The oxygen treatment can be provided in an oxygen atmosphere. The oxygen atmosphere can be, e.g., $O_2$, $NO_2$ or $CO_2$, in a carrier gas in a CVD chamber. For example, the oxygen treatment can be provided after the start of the deposition process using the same CVD chamber as the deposition process. For example, the oxidation treatment can be provided after the start of or at the end of the deposition process of the block material 16. In this way, the oxidation can be provided in situ. Alternatively, the oxygen treatment can be provided prior to the deposition interlevel dielectric material, e.g., oxygen pre-treatment before SiCOH deposition, in either an external tool or within the deposition chamber. As an example, the oxygen treatment can be provided using a remote plasma tool, after the deposition process. In embodiments, the oxygen treatment should not affect the underlying metal features, e.g., wiring structure 12.

Still referring to FIG. 1, an interlevel dielectric material 20 is deposited over the block material 16 and, in more specific embodiments, the interlevel dielectric material 20 can be bulk SiCOH deposited directly on the oxidized layer 18 using a conventional blanket deposition process, e.g., CVD. Accordingly, in this latter implementation, the oxygen treatment process would occur prior to the deposition of the interlevel dielectric material 20. In embodiments, the etch rate of the interlevel dielectric material 20 and the oxidized layer 18 is similar, as should be understood by those of skill in the art. A stack of hardmasks 22, 24 is deposited on the interlevel dielectric material 20. In embodiments, the hardmask 22 is an ILD hardmask 22 and the hardmask 24 is a TiN hardmask, as examples.

Figure 2:
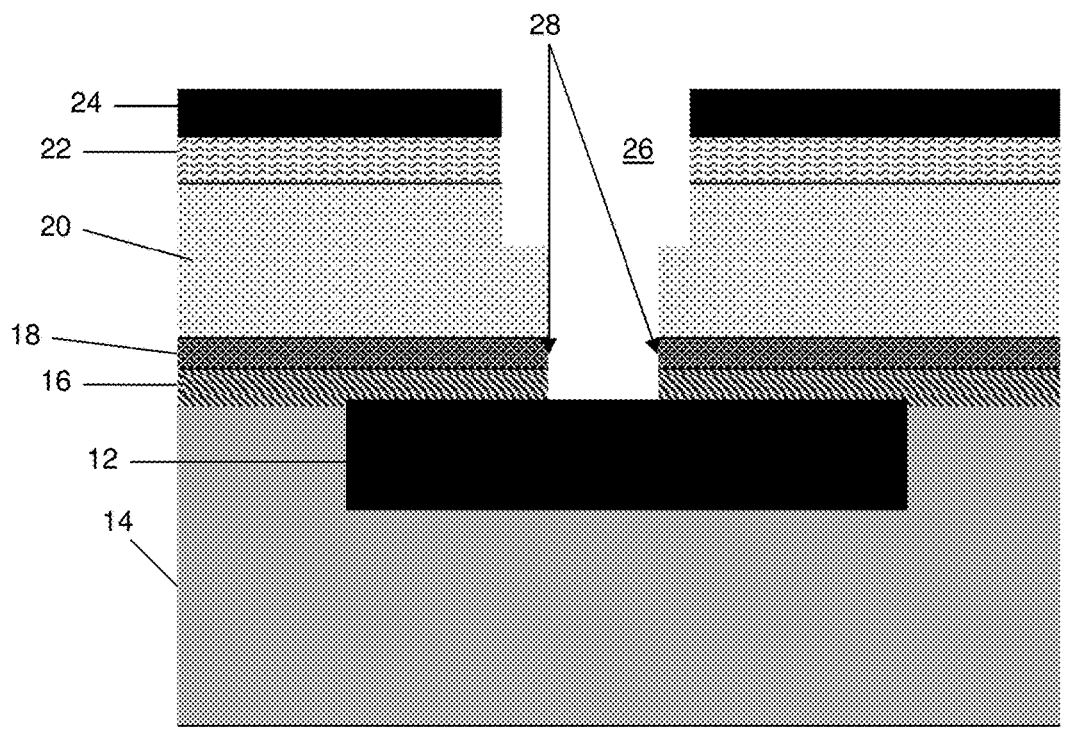
FIG. 2 shows a via with a substantially straight profile, amongst other features, and respective fabrication processes in accordance with aspects of the present disclosure.

FIG. 2 shows a via 26 formed within the structure of FIG. 1. In embodiments, the via 26 can be formed by a conventional dual or single damascene process, as should be understood by those of skill in the art such that no further explanation is required herein. As the etching rate of the interlevel dielectric material 20 and the oxidized layer 18 have a substantially same etch rate, the portion of the via formed within the oxidized layer 18 will have a substantially straight profile 28 (regardless of the thickness of the oxidized layer). In embodiments, the substantially straight profile 28 is it means substantially 90 degrees as measured relative to the horizontal surface of the dielectric material or underlying wiring structure 12. The etching process can be performed using conventional etching cycles, e.g., RIE processes, with the interlevel dielectric material 20 and the oxidized layer 18, amongst the other layers, being etched together, to expose the underlying wiring structure 12.

Figure 3:
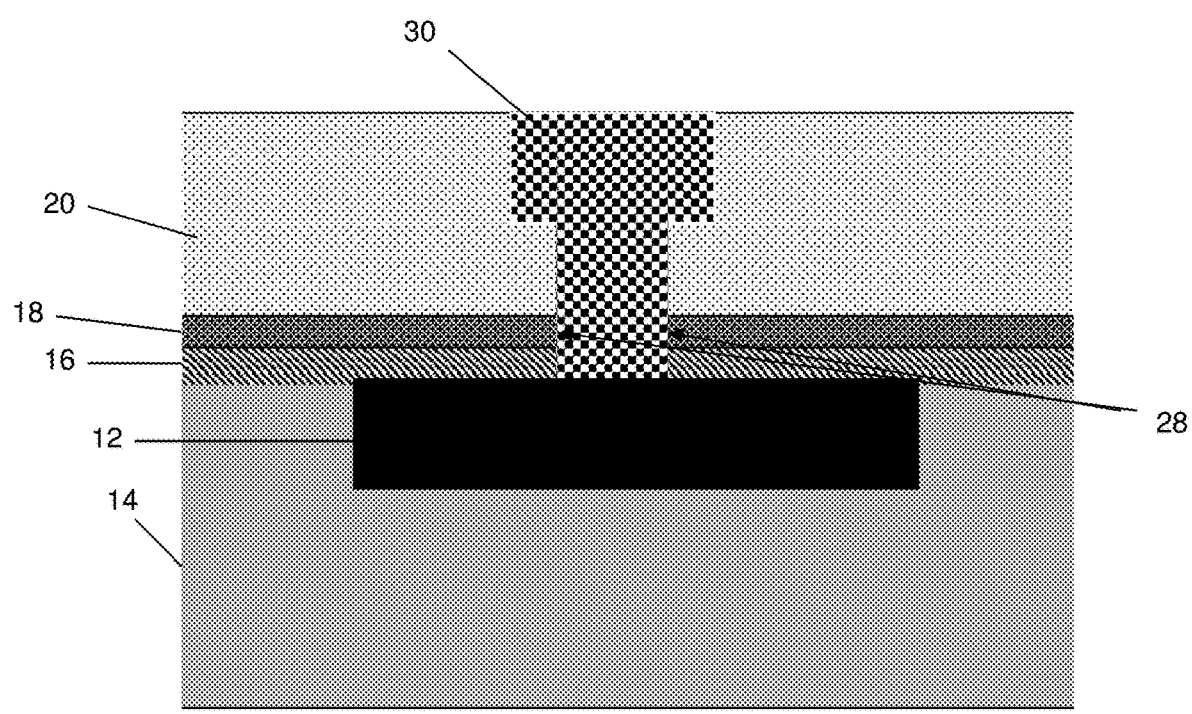
FIG. 3 shows an interconnect contact with a substantially straight profile, amongst other features, and respective fabrication processes in accordance with aspects of the present disclosure.

FIG. 3 shows an interconnect contact 30 with a substantially straight profile, amongst other features, formed in the via 26. Prior to the deposition of the interconnect material, the hardmasks can be removed by known stripping processes. The interconnect contact 30 will be formed within the via by conventional deposition processes, followed by a chemical mechanical polishing (CMP), as an example. In embodiments, the deposition of tungsten can be a CVD process, the deposition of aluminum can be a plasma vapor deposition (PVD) process and other metal or metal alloy materials can be deposited by an electroplating process. The straight profile is due to the fact that the interconnect material is deposited within the via with the straight profile 28.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A method comprising:
   forming a layer of blocking material comprising nitride material over a wiring structure, wherein the nitride material comprises nitrogen-doped silicon carbide material;

oxidizing the nitride material with an oxygen treatment comprising an oxygen atmosphere to form an upper oxidized layer with a thickness of 20% to 30% of a thickness of the nitride material;

forming an interlevel dielectric material contacting the upper oxidized layer, the interlevel dielectric material comprising bulk SiCOH which comprises a substantially same etch profile as the upper oxidized layer;

forming a dual damascene via into the bulk SiCOH, the upper oxidized layer and the nitride material to expose the wiring structure, the dual damascene via having a wider cross sectional profile in the bulk SiCOH than the nitride material and the upper oxidized layer, and the dual damascene via having a substantially straight via profile through the upper oxidized layer due to the substantially same etch profile between the bulk SiCOH and upper oxidized layer; and forming a contact within the dual damascene via, the contact having a substantially straight profile through the upper oxidized layer, the nitride material and the bulk SiCOH.

2. The method of claim 1, wherein oxidizing is performed in a deposition chamber which is used to form the blocking material.

3. The method of claim 1, wherein the oxidizing is performed with a plasma process.

4. The method of claim 1, wherein the upper oxidized layer is in direct contact with and at an interface with the SiCOH and the blocking material comprising nitride material is in direct contact with the wiring structure and a lower dielectric material surrounding the wiring structure.

5. The method of claim 1, wherein the blocking material is composed of nitrogen-doped silicon carbide.

6. The method of claim 1, wherein the blocking material is composed of a low-k dielectric material.

7. The method of claim 6, wherein the thickness of the blocking material is structured to act as a diffusion barrier.

8. The method of claim 7, wherein the oxidized layer has a thickness of about 5 nm to 25 nm.

9. The method of claim 1, wherein the oxygen atmosphere is one of $O_2$, $NO_2$ and $CO_2$, in a carrier gas in a deposition chamber.

10. The method of claim 9, wherein the oxygen treatment is provided after start of the deposition process using the same deposition chamber as deposition for the blocking material.

11. The method of claim 10, wherein the oxygen treatment is after the start of the deposition process of the blocking material.

12. The method of claim 10, wherein the deposition process is with the blocking material.

13. The method of claim 1, wherein the forming of the dual damascene via is performed in a plurality of etching cycles, with the interlevel dielectric material and the upper oxidized layer etched in a same etching cycle, and the blocking material etched in a different etching cycle.

14. The method of claim 13, wherein the upper oxidized layer is directly contacting the interlevel dielectric material and the blocking material.

15. The method of claim 14, wherein the nitride material is deposited directly contacting the wiring structure and an insulator material in which the wiring structure is formed therein and the bulk SiCOH deposited directly on the upper oxidized layer.

16. The method of claim 15, wherein the dual damascene is aligned with and completely over the wiring structure.

17. The method of claim 1, wherein the bulk SiCOH includes both the wider cross sectional profile and a narrower cross sectional profile that is also within the nitride material and the upper oxidized layer.

18. The method of claim 17, wherein the bulk SiCOH comprises an upper portion and a lower portion, the upper portion comprises the wider cross sectional profile which has a larger cross sectional area than the lower portion, the nitride material and the upper oxidized layer, and wherein the lower portion, the nitride material and the upper oxidized layer comprises a same cross sectional profile.

19. The method of claim 18, further comprising forming a stack of hardmasks on the bulk SiCOH, forming an opening in the hardmasks that matches the wider cross sectional profile, and etching through the bulk SiCOH, the upper oxidized layer and the nitride material to expose the wiring structure and removing the stack of hardmasks prior to the forming of the contact.

* * * * *